(12) United States Patent
Yoon

(10) Patent No.: US 8,294,250 B2
(45) Date of Patent: Oct. 23, 2012

(54) WIRING SUBSTRATE FOR A SEMICONDUCTOR CHIP, AND SEMICONDUCOTOR PACKAGE HAVING THE WIRING SUBSTRATE

(75) Inventor: Tae-Sung Yoon, Cheonan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 144 days.

(21) Appl. No.: 12/901,129

(22) Filed: Oct. 8, 2010

(65) Prior Publication Data

US 2011/0084410 A1     Apr. 14, 2011

(30) Foreign Application Priority Data

Oct. 12, 2009  (KR) ......................... 10-2009-0096884

(51) Int. Cl.
*H01L 23/02* (2006.01)
(52) U.S. Cl. ................ 257/680; 257/E23.168; 257/690; 257/780; 438/106; 438/121
(58) Field of Classification Search ........... 257/E23.141, 257/E23.168, 678, 684, 687, 693, 698, 738, 257/777–784, 786, 787, E33.07, 701, 707, 257/680; 438/106, 116, 121
See application file for complete search history.

(56) References Cited

U.S. PATENT DOCUMENTS

| | | | | |
|---|---|---|---|---|
| 5,293,068 A | * | 3/1994 | Kohno et al. | 257/676 |
| 5,384,689 A | * | 1/1995 | Shen | 361/761 |
| 5,858,815 A | * | 1/1999 | Heo et al. | 438/112 |
| 6,048,755 A | * | 4/2000 | Jiang et al. | 438/118 |
| 6,218,731 B1 | * | 4/2001 | Huang et al. | 257/738 |
| 6,252,298 B1 | | 6/2001 | Lee et al. | |
| 6,326,700 B1 | * | 12/2001 | Bai et al. | 257/790 |
| 6,385,049 B1 | * | 5/2002 | Chia-Yu et al. | 361/721 |
| 6,387,796 B1 | * | 5/2002 | Yamada | 438/614 |
| 6,389,689 B2 | * | 5/2002 | Heo | 29/840 |
| 6,400,574 B1 | * | 6/2002 | Stephenson et al. | 361/760 |

(Continued)

FOREIGN PATENT DOCUMENTS

JP       2003-168761       6/2003

(Continued)

OTHER PUBLICATIONS

English Abstract for Publication No. 2003-168761.

(Continued)

*Primary Examiner* — Chris Chu
(74) *Attorney, Agent, or Firm* — F. Chau & Associates, LLC

(57) ABSTRACT

A wiring substrate for a semiconductor chip includes a substrate, first and second wiring layers and a plurality of first and second bonding pads. The substrate has a first surface and a second surface opposite to the first surface, a window extending from the first surface to the second surface to expose chip pads of a semiconductor chip adherable to the first surface. The first and second wiring layers of a multi-layered structure are sequentially formed on the second surface of the substrate with at least one insulation layer interposed between the first and second wiring layers. A plurality of the first and second bonding pads are respectively connected to the first and second wiring layers, the first and second bonding pads having a concavo-convex arrangement on the second surface of the substrate along a side of the window.

11 Claims, 17 Drawing Sheets

U.S. PATENT DOCUMENTS

| | | | | |
|---|---|---|---|---|
| 6,429,372 B1 * | 8/2002 | Taguchi et al. | | 174/535 |
| 6,432,746 B2 * | 8/2002 | Kim et al. | | 438/117 |
| 6,462,274 B1 * | 10/2002 | Shim et al. | | 174/535 |
| 6,479,887 B1 * | 11/2002 | Yoon et al. | | 257/666 |
| 6,521,980 B1 * | 2/2003 | Tandy et al. | | 257/668 |
| 6,522,018 B1 * | 2/2003 | Tay et al. | | 257/780 |
| 6,707,147 B2 * | 3/2004 | Dickey et al. | | 257/702 |
| 6,818,989 B2 * | 11/2004 | Higuchi et al. | | 257/738 |
| 6,822,337 B2 * | 11/2004 | Bai | | 257/783 |
| 6,836,007 B2 * | 12/2004 | Michii et al. | | 257/686 |
| 6,847,104 B2 * | 1/2005 | Huang et al. | | 257/685 |
| 6,870,274 B2 * | 3/2005 | Huang | | 257/780 |
| 6,879,030 B2 * | 4/2005 | Tsai et al. | | 257/680 |
| 6,906,928 B2 * | 6/2005 | Hauser et al. | | 361/764 |
| 6,939,739 B2 * | 9/2005 | Corisis | | 438/108 |
| 6,987,058 B2 * | 1/2006 | Hall | | 438/617 |
| 7,329,945 B2 * | 2/2008 | Moden | | 257/693 |
| 7,378,736 B2 * | 5/2008 | Morrison | | 257/738 |
| 7,443,041 B2 * | 10/2008 | Khiang | | 257/784 |
| 7,456,505 B2 * | 11/2008 | Gospodinova et al. | | 257/784 |
| 7,572,670 B2 * | 8/2009 | Kheng | | 438/106 |
| 7,629,686 B2 * | 12/2009 | Kinsman | | 257/737 |
| 7,759,807 B2 * | 7/2010 | Bae et al. | | 257/790 |
| 8,072,085 B2 * | 12/2011 | Hetzel et al. | | 257/787 |
| 8,116,088 B2 * | 2/2012 | Shin et al. | | 361/760 |
| 2002/0000656 A1 * | 1/2002 | Huang et al. | | 257/736 |
| 2002/0149917 A1 * | 10/2002 | Hauser et al. | | 361/752 |
| 2004/0164389 A1 * | 8/2004 | Lee | | 257/686 |
| 2005/0098870 A1 * | 5/2005 | Thomas et al. | | 257/690 |
| 2005/0253284 A1 * | 11/2005 | Wang et al. | | 257/787 |

FOREIGN PATENT DOCUMENTS

| | | |
|---|---|---|
| KR | 1020060074143 | 7/2006 |

OTHER PUBLICATIONS

English Abstract for Publication No. 1020060074143.

* cited by examiner

FIG. 13
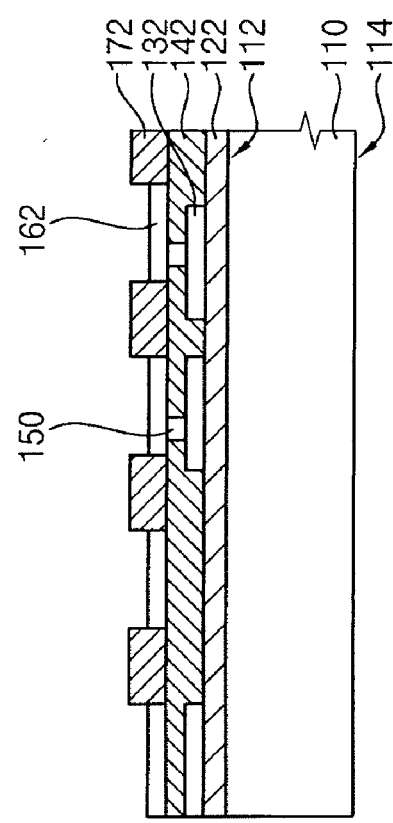
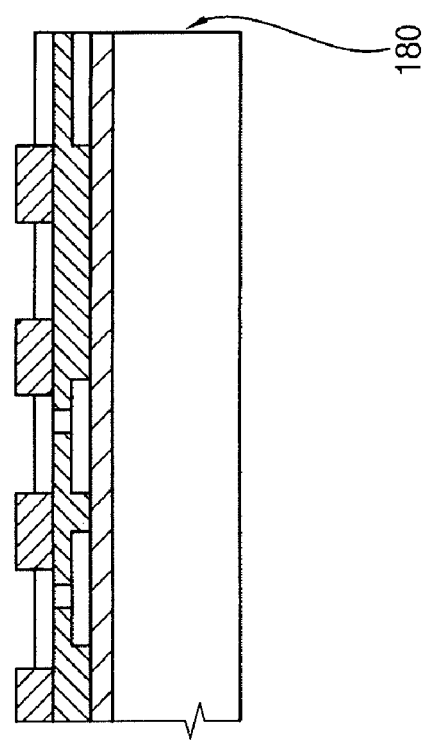

WIRING SUBSTRATE FOR A SEMICONDUCTOR CHIP, AND SEMICONDUCOTOR PACKAGE HAVING THE WIRING SUBSTRATE

PRIORITY STATEMENT

This application claims priority under 35 U.S.C. §119 from Korean Patent Application No. 2009-96884, filed on Oct. 12, 2009 in the Korean Intellectual Property Office (KIPO), the contents of which are herein incorporated by reference in their entirety.

BACKGROUND

1. Field

Exemplary embodiments of the present inventive concept are directed to a wiring substrate for a semiconductor chip, a semiconductor package having the same and a method of manufacturing the semiconductor package. More particularly, exemplary embodiments are directed to a wiring substrate for mounting a semiconductor chip thereon where the semiconductor chip is electrically connected to the wiring substrate by a plurality of bonding wires, a semiconductor package having the same and a method of manufacturing the semiconductor package.

2. Description of the Related Art

In general, a semiconductor package may include a mounting substrate and a semiconductor chip mounted on the mounting substrate. In the semiconductor package, the semiconductor chip may be electrically connected to the mounting substrate by a plurality of bonding wires.

Recently, as the number of input/output signal lines for the semiconductor chip has increased due to the miniaturization electronic products using semiconductor devices, the size of the wiring substrate for mounting the semiconductor chip and line widths between the wiring patterns has decreased.

SUMMARY

Exemplary embodiments of the inventive concept provide a wiring substrate for a semiconductor chip including bonding pads capable of avoiding interference between adjacent bonding wires and having a structure capable of performing high-speed operation.

Exemplary embodiments of the inventive concept provide a semiconductor package including the wiring substrate.

Exemplary embodiments of the inventive concept provide a method of manufacturing the semiconductor package.

According to an exemplary embodiment of the inventive concept, a wiring substrate for a semiconductor chip includes a substrate, first and second wiring layers and a plurality of first and second bonding pads. The substrate has a first surface and a second surface opposite to the first surface, the substrate having a window from the first surface to the second surface. The first and second wiring layers of a multi-layered structure are sequentially formed on the second surface of the substrate with at least one insulation layer interposed between the first and second wiring layers. A plurality of the first and second bonding pads is respectively connected to the first and second wiring layers, the first and second bonding pads having a concavo-convex arrangement on the second surface of the substrate along a side of the window.

In an exemplary embodiment, a plurality of the first and second bonding pads may alternate with each other.

In an exemplary embodiment, the first bonding pad may have a first height from the second surface of the substrate and the second bonding pad may have a second height greater than the first height from the second surface of the substrate.

In an exemplary embodiment, the first bonding pads may be spaced apart from each other by a first distance and the second bonding pads may be spaced apart from each other by a second distance substantially identical to the first distance.

In an exemplary embodiment, the first bonding pads may be spaced apart from each other by a first distance and the width of the second bonding pad may be substantially identical to the first distance.

In another exemplary embodiment, the second bonding pads may be farther away from the side of the window than the first bonding pads.

In an exemplary embodiment, the first and second bonding pads may extend substantially perpendicular to the side of the window.

According to an exemplary embodiment of the inventive concept, a semiconductor package includes a substrate, a semiconductor chip, first and second wiring layers, a plurality of first and second bonding pads and a plurality of bonding wires. The substrate has a first surface and a second surface opposite to the first surface, the substrate having a window. The semiconductor chip is adhered to the first surface of the substrate and has chip pads exposed through the window. The first and second wiring layers having a multi-layered structure are sequentially formed on the second surface of the substrate with at least one insulation layer interposed between the first and second wiring layers. A plurality of the first and second bonding pads is respectively connected to the first and second wiring layers, the first and second bonding pads having a concavo-convex arrangement on the second surface of the substrate along a side of the window. A plurality of the bonding wires extend from the chip pads through the window to be connected to the first and second bonding pads.

In an exemplary embodiment, a plurality of the first and second bonding pads may alternate with each other.

In an exemplary embodiment, the first bonding pad may have a first height from the second surface of the substrate and the second bonding pad may have a second height greater than the first height from the second surface of the substrate.

In an exemplary embodiment, the first bonding pads may be spaced apart from each other by a first distance and the second bonding pads may bee spaced apart from each other by a second distance substantially identical to the first distance.

In an exemplary embodiment, the first bonding pads may be spaced apart from each other by a first distance and the width of the second bonding pad may be substantially identical to the first distance.

In another exemplary embodiment, the second bonding pads may be farther away from the side of the window than the first bonding pads.

According to an exemplary embodiment of the inventive concept, in a method of manufacturing a semiconductor package, first and second preliminary substrates are prepared. Each of the first and second preliminary substrate has a first surface and a second surface opposite to the first surface. The first and second preliminary substrates are adhered to each other with an adhesive layer interposed between the second surfaces of the first and second preliminary substrates. First and second wiring layers having a multi-layered structure are formed, wherein the first and second wiring layers are sequentially formed on the first surfaces of the first and second preliminary substrates respectively, with at least one insulation layer interposed between the first and second wiring layers. A plurality of first and second bonding pads is formed to be respectively connected to the first and second wiring layers, the first and second bonding pads having a concavo-convex arrangement along a first direction on the first surface of the preliminary substrate. The adhesive layer is removed to separate the first and second preliminary substrates. Each of the first and second preliminary substrates is divided to form a plurality of substrates. A semiconductor chip is mounted on the substrate.

In an exemplary embodiment, first insulation layers are formed on the first surfaces of the first and second preliminary substrates, respectively. To form the first and second wiring layers, first conductive layers are formed on the first insulation layers. The first conductive layers are patterned to form first wiring layers on the first and second preliminary substrates, respectively. Second insulation layers are formed on the first wiring layers. Second conductive layers are formed on the second insulation layers. The second conductive layers are patterned to form second wiring layers, wherein plugs penetrate the second insulation layer to electrically connect the first wiring layer to the second wiring layer.

The method may further include patterning the second insulation layer to form an insulation layer pattern having through-holes and filling the through-holes with conductive material to form the plug.

In an exemplary embodiment, the first and second bonding pads may be formed by an electroplating process.

In an exemplary embodiment, forming a plurality of the substrates may include forming a window in the middle region of the substrate such that the first and second bonding pads having a concavo-convex arrangement are formed along a side of the window.

In an exemplary embodiment, a plurality of the first and second bonding pads may alternate with each other, the first bonding pads may have a first height from the second surface of the substrate and the second bonding pads may have a second height greater than the first height from the second surface of the substrate.

In an exemplary embodiment, the first bonding pads may be spaced apart from each other by a first distance and the width of the second bonding pad may be substantially identical to the first distance.

According to exemplary embodiments, a mounting substrate for a semiconductor chip may include first and second wiring layers having a multi-layered structure. The first and second wiring layers are sequentially formed on a surface of a substrate with at least one insulation layer interposed between the first and second wiring layers. The mounting substrate may include a plurality of first and second bonding pads having a concavo-convex arrangement along a side of a window on the surface of the substrate. The first and second bonding pads may be connected to the first and second wiring layers, respectively.

Accordingly, signal paths between the first and second wiring layers may be decreased as compared to those between wiring layers that are respectively formed on opposite surfaces of the substrate, to improve the high speed performance of a semiconductor package. Further, the first and second bonding pads are arranged respectively on the first and second wiring layers having different heights from the surface of the substrate. Accordingly, the spacing distance between the first and second bonding pads may be minimized to prevent a contact failure between adjacent bonding wires respectively connected to the adjacent first and second bonding pads.

BRIEF DESCRIPTION OF THE DRAWINGS

FIGS. 1 to 17 represent non-limiting, exemplary embodiments as described herein.

FIG. 1 is a plan view illustrating a semiconductor package in accordance with an exemplary embodiment of the inventive concept.

FIG. 2 is a cross-sectional view taken along the line II-II' in FIG. 1.

FIG. 3 is a cross-sectional view taken along the line III-III' in FIG. 1.

FIG. 4 is a perspective view illustrating first and second bonding pads of the semiconductor package in FIG. 1.

FIGS. 5 to 15 are cross-sectional views illustrating a method of manufacturing a semiconductor package in accordance with an exemplary embodiment of the inventive concept.

FIG. 16 is a plan view illustrating a semiconductor package in accordance with another exemplary embodiment of the inventive concept.

FIG. 17 is a perspective view illustrating first and second bonding pads of the semiconductor package in FIG. 16.

DETAILED DESCRIPTION OF EXEMPLARY EMBODIMENTS

Figure 1:
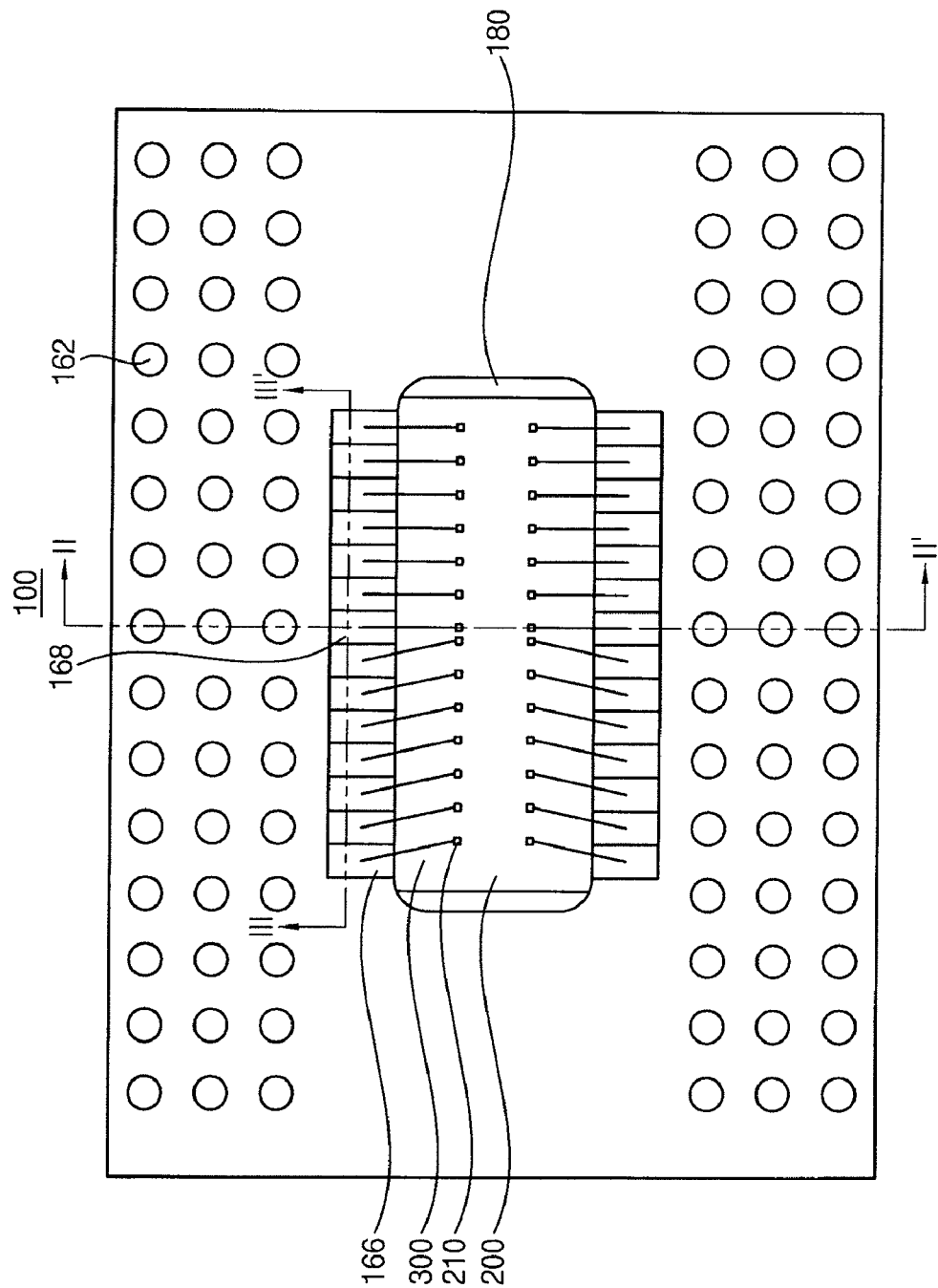

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

Hereinafter, exemplary embodiments of the inventive concept will be explained in detail with reference to the accompanying drawings.

Figure 2:
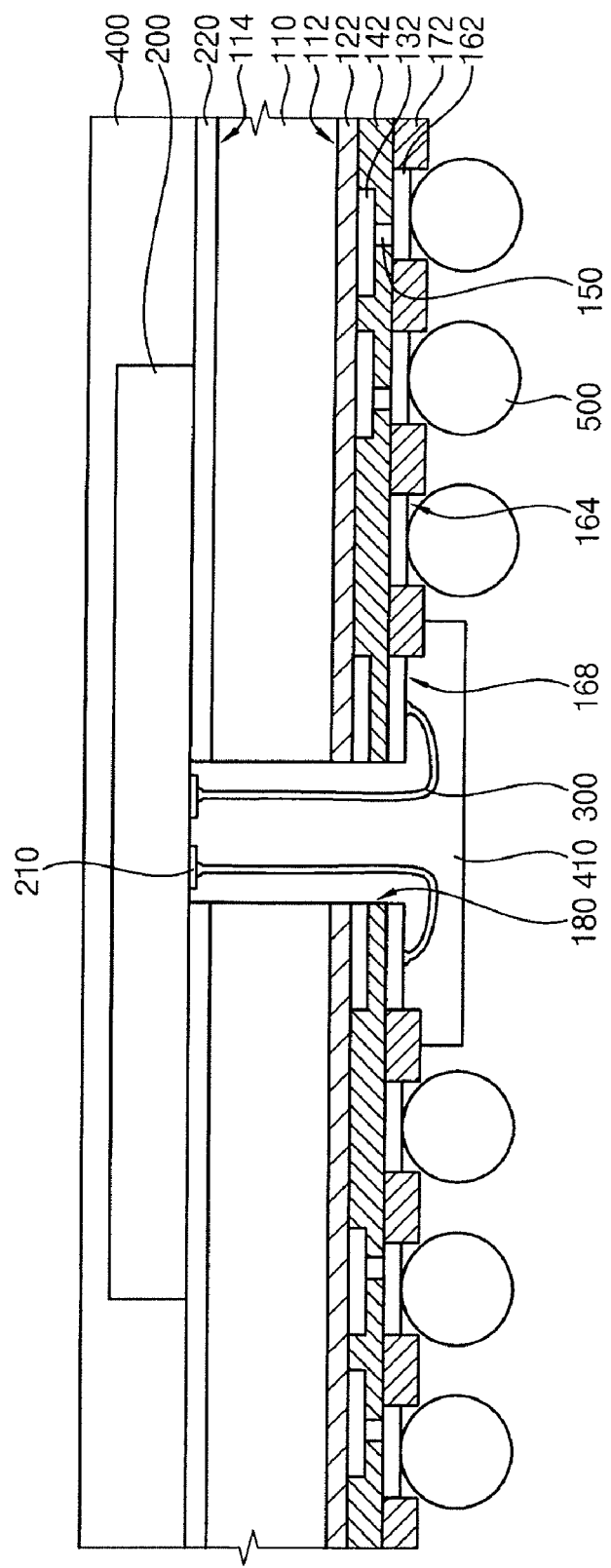
Figure 3:
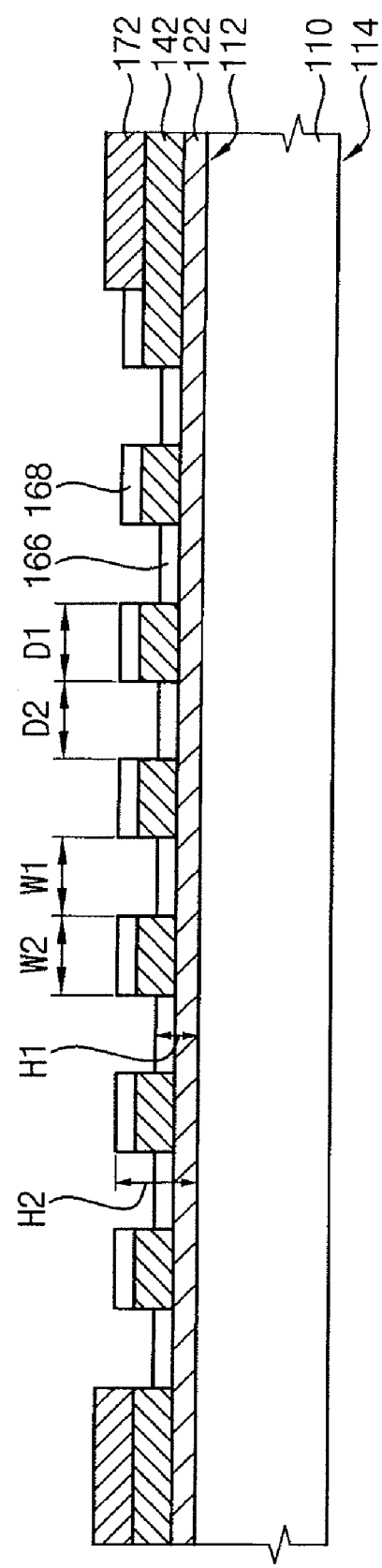
Figure 4:
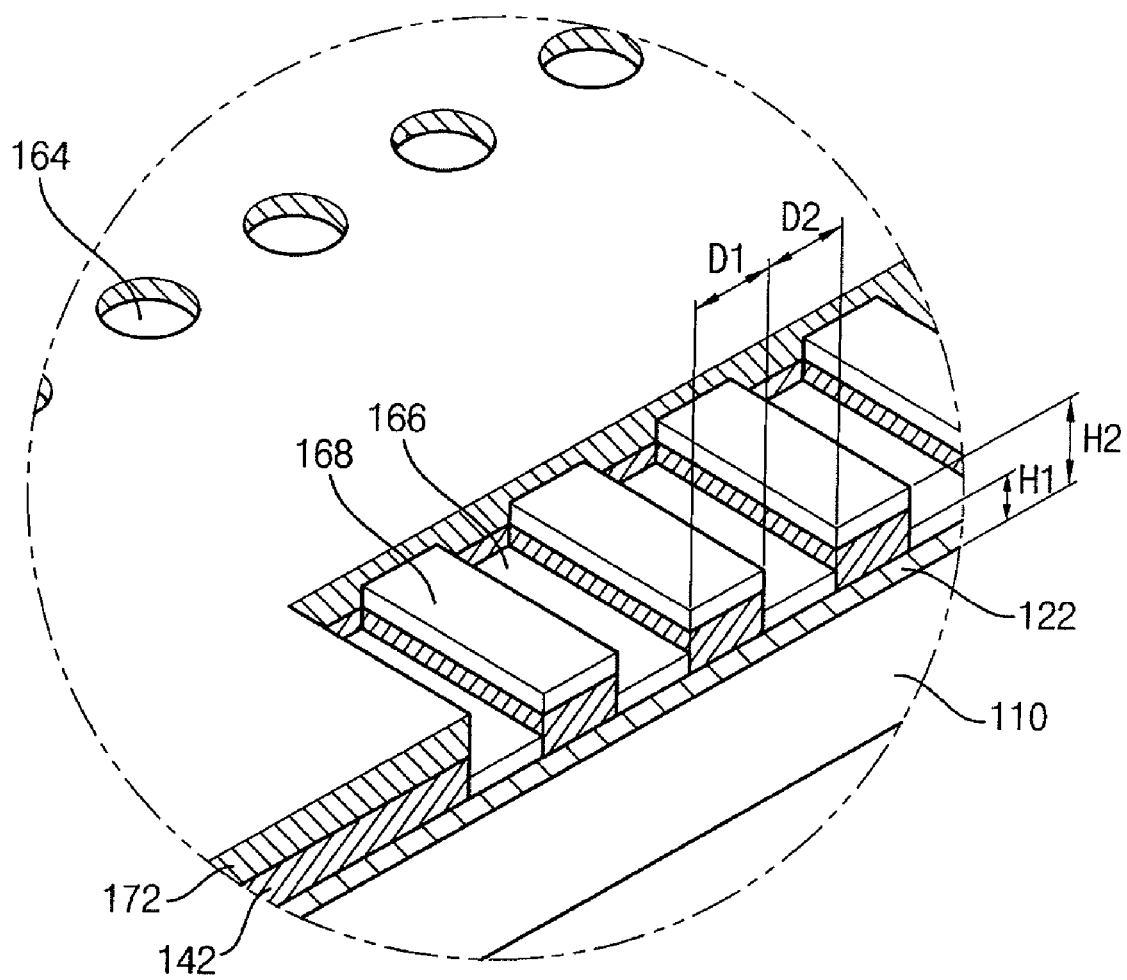

FIG. 1 is a plan view illustrating a semiconductor package in accordance with an exemplary embodiment of the inventive concept. FIG. 2 is a cross-sectional view taken along the line II-II' in FIG. 1. FIG. 3 is a cross-sectional view taken along the line III-III' in FIG. 1. FIG. 4 is a perspective view illustrating first and second bonding pads of the semiconductor package in FIG. 1.

Referring to FIGS. 1 to 4, a semiconductor package 100 includes a mounting substrate, a semiconductor chip 200 mounted on the mounting substrate and a plurality of bonding wires 300 electrically connecting the semiconductor chip 200 to the mounting substrate.

A mounting substrate according to an exemplary embodiment may include a substrate 110 having first and second surfaces 112 and 114 opposite to each other, first and second wiring layers 132 and 162 sequentially formed on the first surface 112 of the substrate, and a plurality of first and second bonding pads 166 and 168 respectively connected the first and second wiring layers 132 and 162 formed on the substrate 110.

A window 180 may be formed in the middle region of the substrate 110. The window 180 may penetrate the substrate 110. The window 180 may have a rectangular shape.

The semiconductor chip 200 may be mounted on the second surface 114 of the substrate 110. The semiconductor chip 200 may be adhered to the substrate 110 via an adhesive film 220. A plurality of the chip pads 210 may be formed on an active surface of the semiconductor chip 200. The chip pads 210 of the semiconductor chip 200 may be exposed through the window 180. Although not illustrated in the figures, at least one semiconductor chip may be additionally formed on the semiconductor chip 200.

In an exemplary embodiment, the semiconductor chip 200 may include a plurality of the circuit elements. The circuit element may include a plurality of memory devices. Examples of the memory devices include a volatile memory device and a non-volatile memory device. Examples of the volatile memory device include a DRAM, a SRAM, etc. Examples of the non-volatile memory device include an EPROM, an EEPROM, a Flash EEPROM, etc.

The first and second wiring layers 132 and 162 may be sequentially formed on the first surface 112 of the substrate 110. The first and second wiring layers 132 and 162 may be stacked via at least one insulation layer interposed between the first and second wiring layers 132 and 162 to form a multi-layer structure.

In an exemplary embodiment, a first insulation layer 122 may be formed on the first surface 112 of the substrate. The first wiring layer 132 may be formed on the first insulation layer 122. For example, the first insulation layer 122 may include polyimide, epoxy, etc. The first wiring layer 132 may include a metal, such as copper, gold, etc.

A first insulation layer pattern 142 may be formed on the first insulation layer 122. Plugs 150 may be provided in the first insulation layer pattern 142 to penetrate the first insulation layer pattern 142. The first insulation layer pattern 142 may include a solder resist. Alternatively, the first insulation layer pattern 142 may include a core layer such as the substrate. The plug 150 may include a metal, such as copper, gold, etc.

The second wiring layer 162 may be formed on the first insulation layer pattern 142. A second insulation layer pattern 172 may be formed on the second wiring layer 162. The second wiring layer 162 may be electrically connected to the first wiring layer 132 by the plugs 150 that penetrate the first insulation layer pattern 142.

Accordingly, the first and second wiring layers 132 and 162 may be sequentially formed on the first surface 112 of the substrate 110 with the first insulation layer 122 and the first insulation layer pattern 142 such that at least one insulation layer is interposed therebetween to form a multi-layer structure.

In an exemplary embodiment, the first wiring layer 132 may include a first circuit pattern serving as a power wiring and the second wiring layer 162 may include a second circuit pattern serving as a signal wiring. Because the first and second wiring layers 132 and 162 are sequentially stacked on the surface of the substrate 110, signal paths between the first and second wiring layers 132 and 162 are shorter compared to those between wiring layers that are respectively formed on opposite surfaces of the substrate, thus improving high speed performance.

A plurality of the first and second bonding pads 166 and 168 may be arranged on the first surface 112 of the substrate 110 along a side of the window 180. The first bonding pads 166 may be exposed through the first and second insulation layer patterns 142 and 172. The second bonding pads 168 may be exposed through the second insulation layer pattern 172.

In an exemplary embodiment, the first bonding pad may be formed on a first bonding pad portion of the first wiring layer 132 by a plating process. The second bonding pad 168 may be formed on a second bonding pad portion of the second wiring layer 162 by a plating process. Accordingly, the first bonding pads 166 may be connected to the first wiring layer 132, and the second bonding pads 168 may be connected to the second wiring layer 162.

As illustrated in FIGS. 3 and 4, in an exemplary embodiment, the first and second bonding pads 166 and 168 may alternate with each other along the side of the window 180. The first bonding pad 166 may have a first height H1 from the first surface 112 of the substrate 110 and the second bonding pad 168 may have a second height H2 greater than the first height H1 from the first surface 112 of the substrate 110.

Accordingly, since the second bonding pad 168 is formed to be stepped up from the first bonding pad 166, a plurality of the first and second bonding pads 166 and 168 may have a concavo-convex arrangement.

The first bonding pads 166 may be spaced apart from each other by a first distance D1 and the second bonding pads 168 may be spaced apart from each other by a second distance D2. The first bonding pad 166 may have a first width W1 and the second bonding pad 168 may have a second width W2.

In an exemplary embodiment, the first distance D1 may be substantially identical to the second distance D2. The first width W1 may be substantially identical to the second width W2. The first distance D1 may be substantially identical to the second width W2 of the second bonding pad 168. The second distance D2 may be substantially identical to the first width W1 of the first bonding pad 166.

In an exemplary embodiment, the first and second bonding pads 166 and 168 may have rectangular shapes. The first and second bonding pads 166 and 168 may extend substantially perpendicular to the extending direction of the window 180. The first and second bonding pads 166 and 168 may be disposed a same distance inward from the side of the window 180.

The first and second bonding pads 166 and 168 may be connected to the chip pads 210 of the semiconductor chip 200 by the bonding wires 300, respectively. The bonding wires 300 may extend from the chip pads 210 of the semiconductor chip 200 through the window 180 to connect to the first and second bonding pads 166 and 168 on the first surface 112 of the substrate 110. Accordingly, the semiconductor chip 200 may be electrically connected to the mounting substrate by the bonding wires 300.

A first sealing member 400 may be formed on the second surface 114 of the substrate 110 to cover the semiconductor chip 200, to protect the semiconductor chip 200 from the outside. A second sealing member 410 may be formed on the first surface 112 of the substrate 110 to cover the bonding wires 300 and window 180.

In an exemplary embodiment, a plurality of solder ball pads 164 may be provided on the first surface 112 of the substrate 110. The solder ball pads 164 may be exposed through the second insulation layer pattern 172. For example, the solder ball pad 164 may be formed on a solder pad portion of the second wiring layer 162 by a plating process.

A solder ball 500 may be disposed on the solder ball pad 164, and the semiconductor package 100 may be mounted on a module substrate (not illustrated) via the solder balls 500 to provide memory module (not illustrated).

According to an exemplary embodiment, the mounting substrate for a semiconductor chip may have a multi-layered structure of the first and second wiring layers 132 and 162 stacked on the surface of the substrate 110. Because the first and second wiring layers 132 and 162 are sequentially stacked on the surface of the substrate 110, signal paths between the first and second wiring layers 132 and 162 may be decreased as compared to those between wiring layers that are respectively formed on opposite surfaces of the substrate, to thereby improve high speed performance.

Further, the mounting substrate may include a plurality of the first and second bonding pads 166 and 168 having a concavo-convex arrangement along the side of the window 180 in the surface of the substrate. Accordingly, the first and second bonding pads 166 and 168 having different heights may alternate on the surface of the substrate 110.

In an exemplary embodiment, the first and second bonding pads 166 and 168 may alternate with each other along the side of the window 180. Accordingly, as illustrated in FIG. 1, even though the first and second bonding pads 166 and 168 are not spaced apart from each other, the first and second bonding pads 166 and 168 having different heights alternate on the first and second wiring layers. Accordingly, the spacing distance between the first and second bonding pads 166 and 168 may be minimized.

Further, because the bonding wires 300 are connected respectively to the first and second boding pads 166 and 168 having different heights, an electrical short or interference between adjacent bonding wires respectively connected to the adjacent first and second bonding pads 166 and 168 may be prevented.

Hereinafter, a method of manufacturing a semiconductor package in accordance with an exemplary embodiment of the inventive concept will be explained.

FIGS. 5 to 15 are cross-sectional views illustrating a method of manufacturing a semiconductor package in accordance with an exemplary embodiment of the inventive concept.

Figure 5:
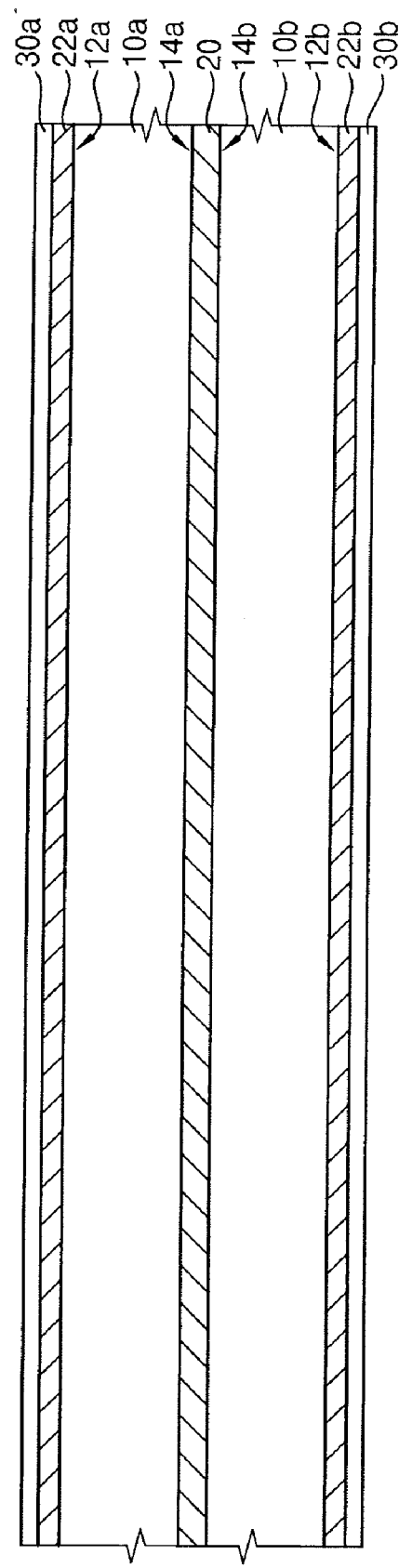

Referring to FIG. 5, after first and second preliminary substrates 10*a* and 10*b* are prepared, the first and second preliminary substrate 10*a* and 10*b* are adhered to each other using an adhesive layer 20 interposed therebetween.

In an exemplary embodiment, the first preliminary substrate 10*a* may have first and second surfaces 12*a* and 14*a* opposite to each other. The second preliminary substrate 10*b* may have first and second surfaces 12*b* and 14*b* opposite to each other. The adhesive layer 20 may be interposed between the second surfaces 14*a* and 14*b* of the first and second preliminary substrates 10*a* and 10*b* to adhere the first and second preliminary substrate 10*a* and 10*b*. For example, the adhesive layer 20 may include polyimide, epoxy, etc.

First conductive layers 30*a* and 30*b* are formed respectively on the first surfaces 12*a* and 12*b* of the first and second preliminary substrate 10*a* and 10*b*. For example, after first insulation layers 22*a* and 22*b* are formed respectively on the first surfaces 12*a* and 12*b*, the first conductive layers 30*a* and 30*b* may be formed respectively on the first insulation layers 22*a* and 22*b*. The first insulation layer 22*a* and 22*b* may include polyimide, epoxy, etc. The first conductive layer 30*a* and 30*b* may include a metal such as copper, gold, etc.

Alternatively, after the first conductive layers 30*a* and 30*b* are formed respectively on the first and second preliminary substrate 10*a* and 10*b*, the first and second preliminary substrates 10*a* and 10*b* may be adhered to each other. In this case, copper foils may be formed on both surfaces of the first preliminary substrate 10*a* after which the copper foil on the one surface of the first preliminary substrate 10*a* may be removed. In addition, copper foils may be formed on both surfaces of the second preliminary substrate 10*b* after which the copper foil on the one surface of the second preliminary substrate 10*b* may be removed. Thus, after the first and second preliminary substrates 10*a* and 10*b* are formed respectively to have the copper foil on the one surface thereof, the first and second preliminary substrate 10*a* and 10*b* may be adhered to each other.

Figure 6:
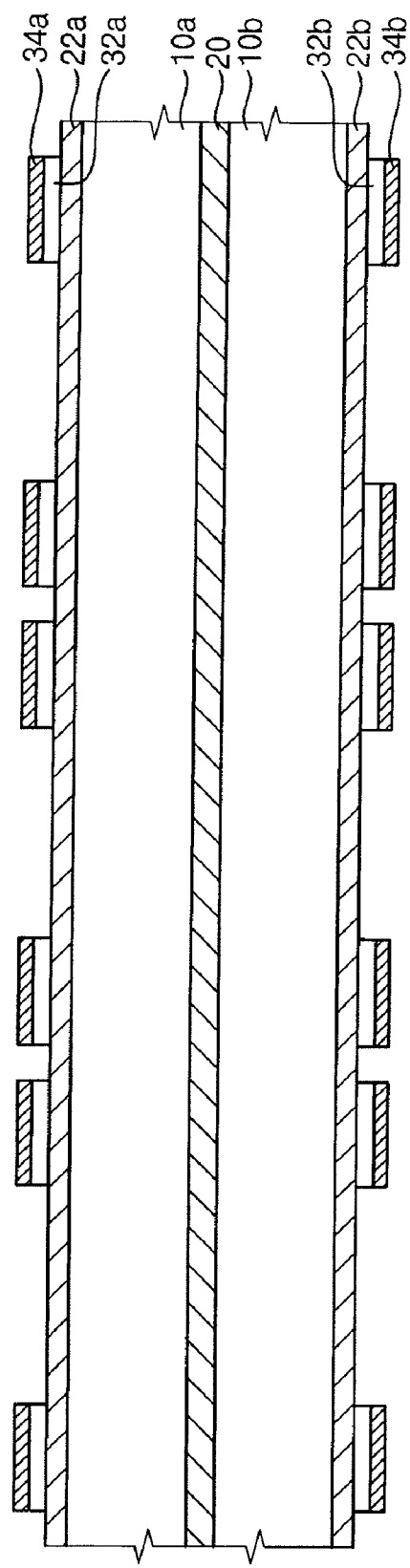

Referring to FIG. 6, the first conductive layers 30*a* and 30*b* are patterned to form, first wiring layers 32*a* and 32*b* on the first surfaces 12*a* and 12*b* of the first and second preliminary substrates 10*a* and 10*b*, respectively.

For example, after photoresist patterns 34*a* and 34*b* are formed on the first conductive layers 30*a* and 30*b*, the first conductive layers 30*a* and 30*b* may be etched using the photoresist patterns 34*a* and 34*b* as etching masks to form the first wiring layers 32*a* and 32*b*, respectively. Then, the photoresist patterns 34*a* and 34*b* may be removed from the first and second preliminary substrates 10*a* and 10*b*, respectively.

In an exemplary embodiment, each of the first wiring layers 32*a* and 32*b* may be patterned to include first bonding pad portions that are used to form first bonding pads by a subsequent plating process. In addition, each of the first wiring layers 32*a* and 32*b* may include a first circuit pattern serving as a power wiring.

Figure 7:
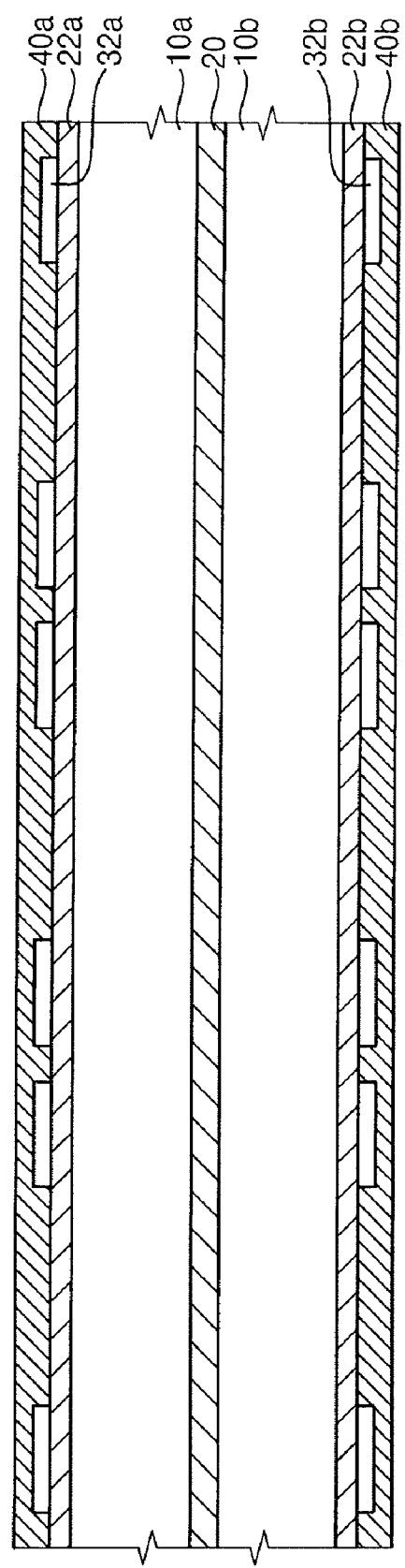

Referring to FIG. 7, second insulation layers 40*a* and 40*b* are formed on the first insulation layers 22*a* and 22*b* to cover the first wiring layers 32*a* and 32*b*, respectively. The second insulation layers 40*a* and 40*b* may be formed using a solder resist.

Figure 8:
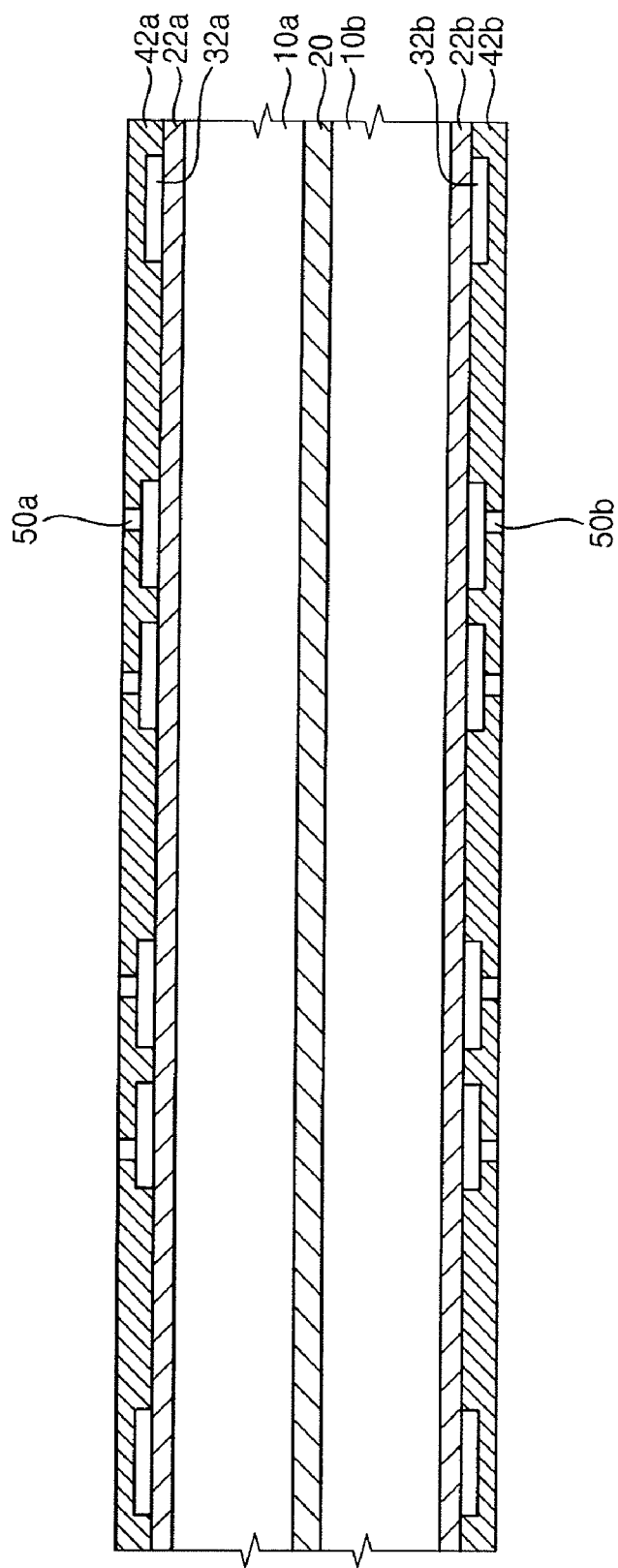
Figure 9:
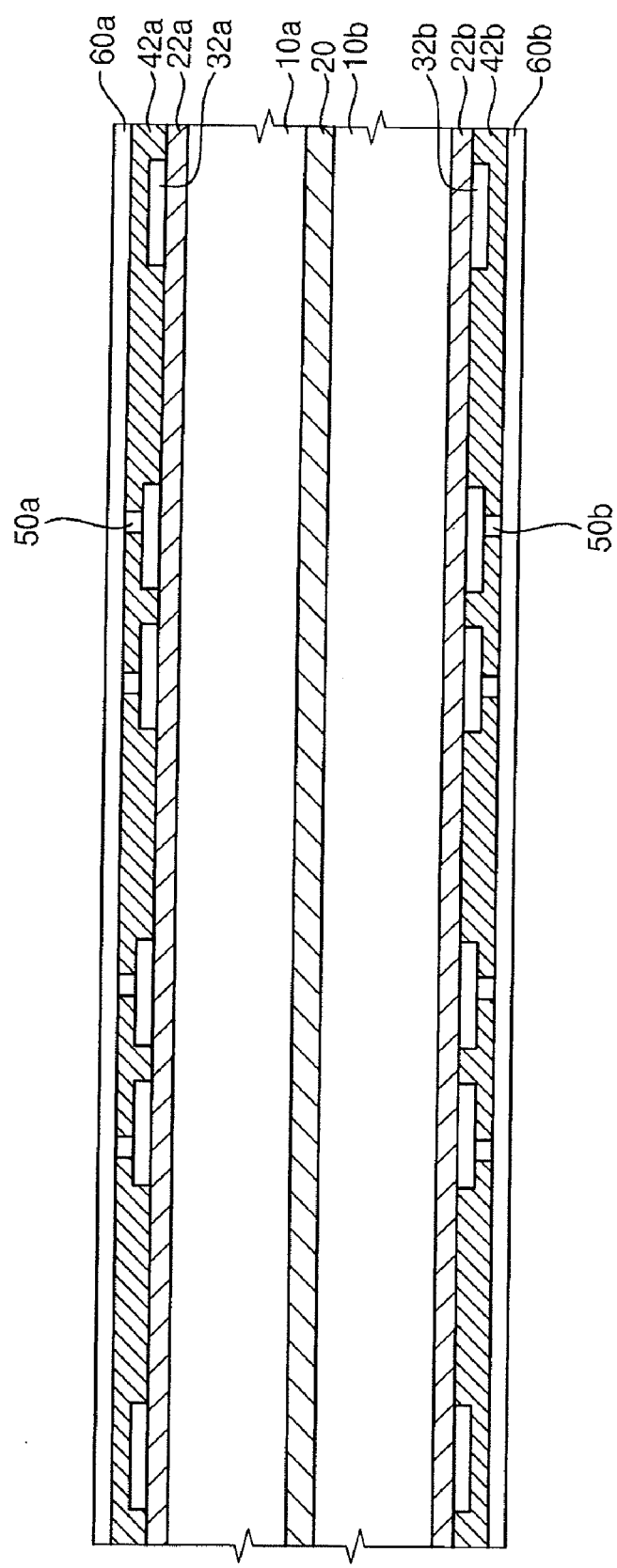

Referring to FIGS. 8 and 9, the second insulation layers 40*a* and 40*b* are patterned to form first insulation layer patterns 42*a* and 42*b* having through-holes, respectively. The through-holes of the first insulation layer patterns 42*a* and 42*b* expose portions of the first wiring layers 32*a* and 32*b*. Then, the through-holes of the first insulation layer patterns 42*a* and 42*b* are filled with conductive material to form plugs 50*a* and 50*b*, respectively. Examples of the conductive material may include copper, gold, etc.

Then, second conductive layers 60*a* and 60*b* are formed respectively on the first insulation layer patterns 42*a* and 42*b*. For example, the second conductive layers 60*a* and 60*b* may be formed using a metal such as copper, gold, etc.

Alternatively, other preliminary substrates including the second conductive layers 60*a* and 60*b* formed thereon may be adhered to the first wiring layers 32*a* and 32*b*, respectively. For example, after the second conductive layers 60*a* and 60*b* are formed respectively on the first insulation layer patterns 42*a* and 42*b*, the first insulation layer patterns 42*a* and 42*b* may be adhered to the first wiring layers 32*a* and 32*b*, respectively.

Then, the plugs are formed to penetrate the first insulation layer patterns 42*a* and 42*b*, respectively.

Figure 10:
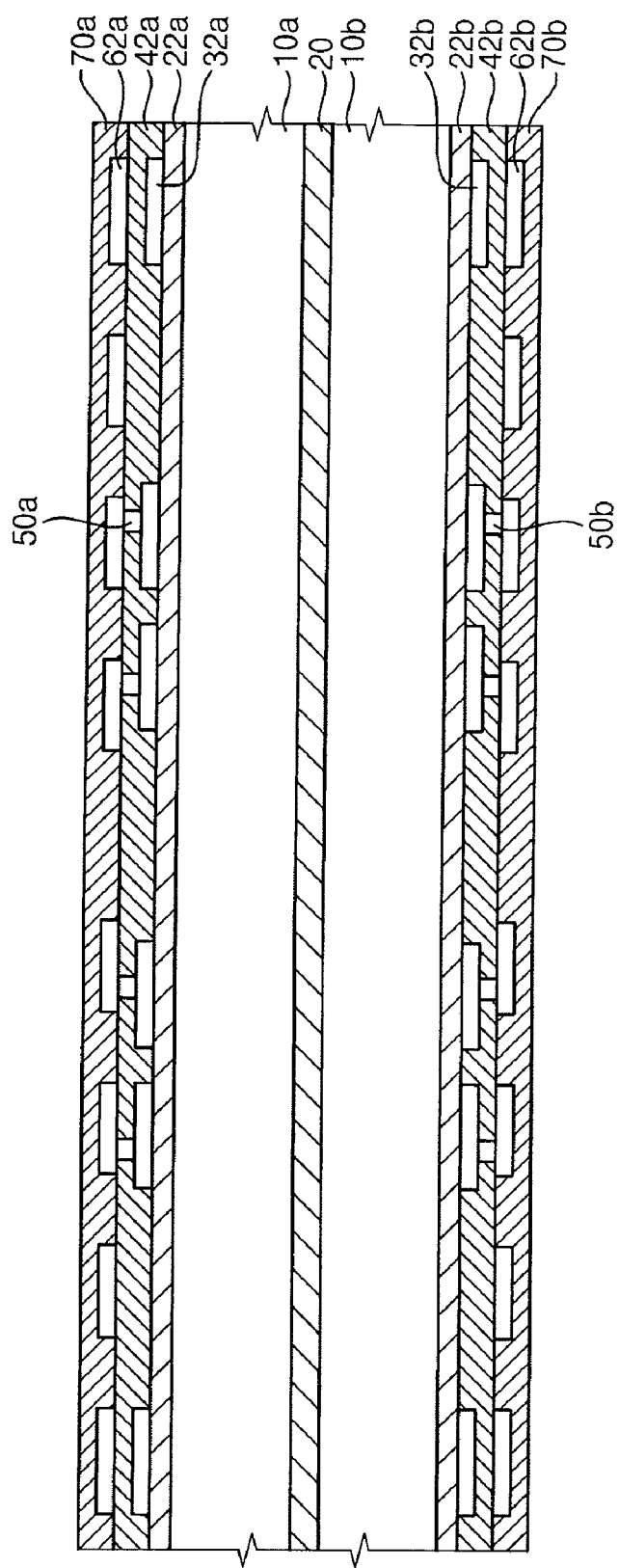

Referring to FIG. 10, the second conductive layers 60*a* and 60*b* are patterned to form second wiring layers 62*a* and 62*b* on the first wiring layers 32*a* and 32*b*, respectively.

For example, after photoresist patterns (not illustrated) are formed on the second conductive layers 60*a* and 60*b*, the second conductive layers 60*a* and 60*b* may be etched using the photoresist patterns as etching masks to form the second wiring layers 62*a* and 62*b*, respectively. The second wiring layers 62*a* and 62*b* may be electrically connected to the first wiring layers 32*a* and 32*b* by the plugs 50*a* and 50*b* penetrating the second insulation layers, respectively.

In an exemplary embodiment, each of the second wiring layers 62*a* and 62*b* may be patterned to include second bonding pad portions that are used to form second bonding pads by a subsequent plating process. In addition, each of the second wiring layers 62*a* and 62*b* may include a second circuit pattern serving as signal wiring.

Then, third insulation layers 70*a* and 70*b* are formed on the second wiring layers 62*a* and 62*b*, respectively. The third insulation layers 70*a* and 70*b* may be formed using a solder resist.

Thus, the first and second wiring layers 32a, 32b, 62a and 62b are sequentially formed on the first surfaces 12a and 12b of the first and second preliminary substrate 10a and 10b, and stacked with at least one insulation layer interposed therebetween to form a multi-layer structure.

Figure 11:
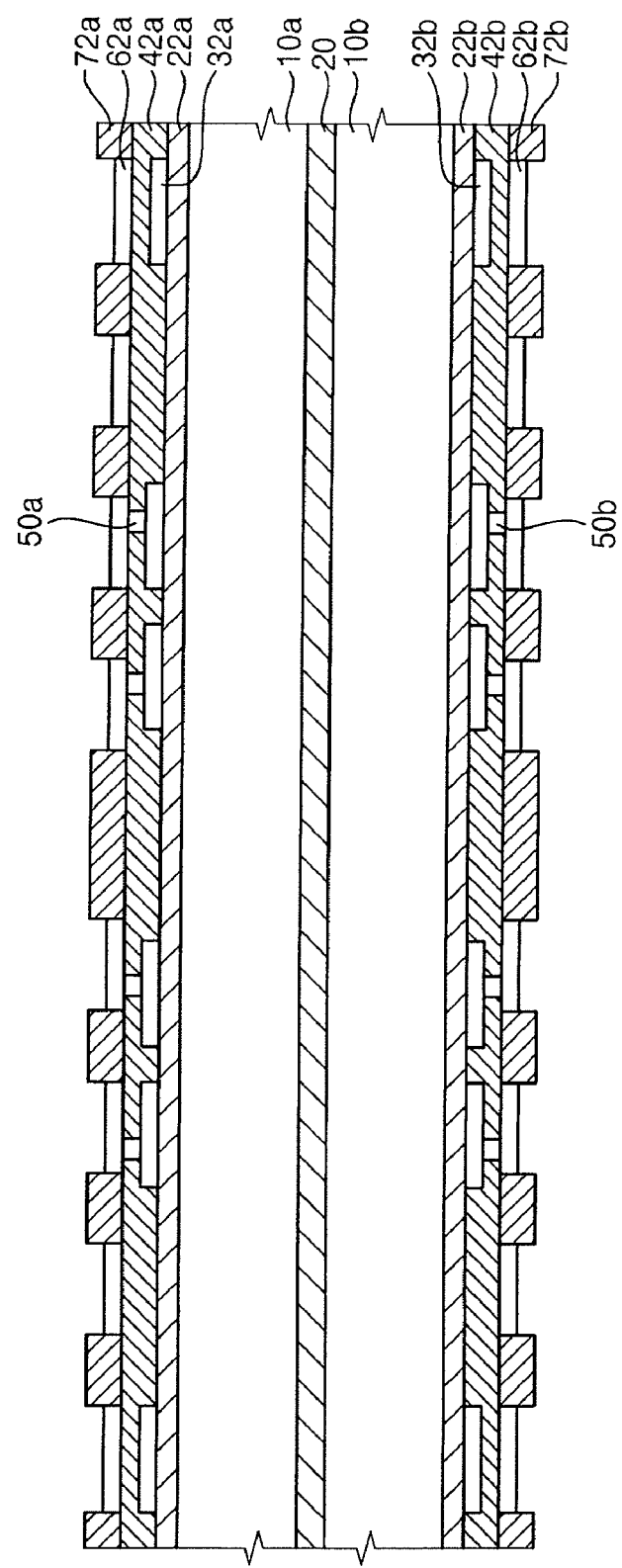

Referring to FIG. 11, second insulation layer patterns 72a and 72b are formed on the second wiring layers 62a and 62b, respectively. The second bonding pad portions and solder pad portions of the second wiring layers 62a and 62b may be exposed through the second insulation layer patterns 72 and 72b, respectively. In addition, the first bonding pad portions of the first wiring layers 32a and 32b may be exposed through the first and second, insulation layer patterns 42a, 42b, 72a and 72b, respectively.

Then, a plating process is performed using a plating wiring (not illustrated) that is connected to the first and second wiring layers 32a, 32b, 62a and 62b to form plating layers on the first bonding pad portions, the second bonding pad portions and the solder ball pad portions exposed through the first and second insulation layer patterns 42a, 42b, 72a and 72b, respectively. The plating process may be an electroplating process.

Thus, as illustrated in FIGS. 1, 2 and 4, a plurality of first and second bonding pads 166 and 168 and solder ball pads 164 are formed to be connected to the first and second wiring layers 32a, 32b, 62a and 62b on the first surfaces 12a and 12b of the first and second preliminary substrates 10a and 10b, respectively. The first and second bonding pads 166 and 168 and the solder ball pads 164 are exposed through the first and second insulation layer patterns 42a, 42b, 72a and 72b, respectively.

Figure 12:
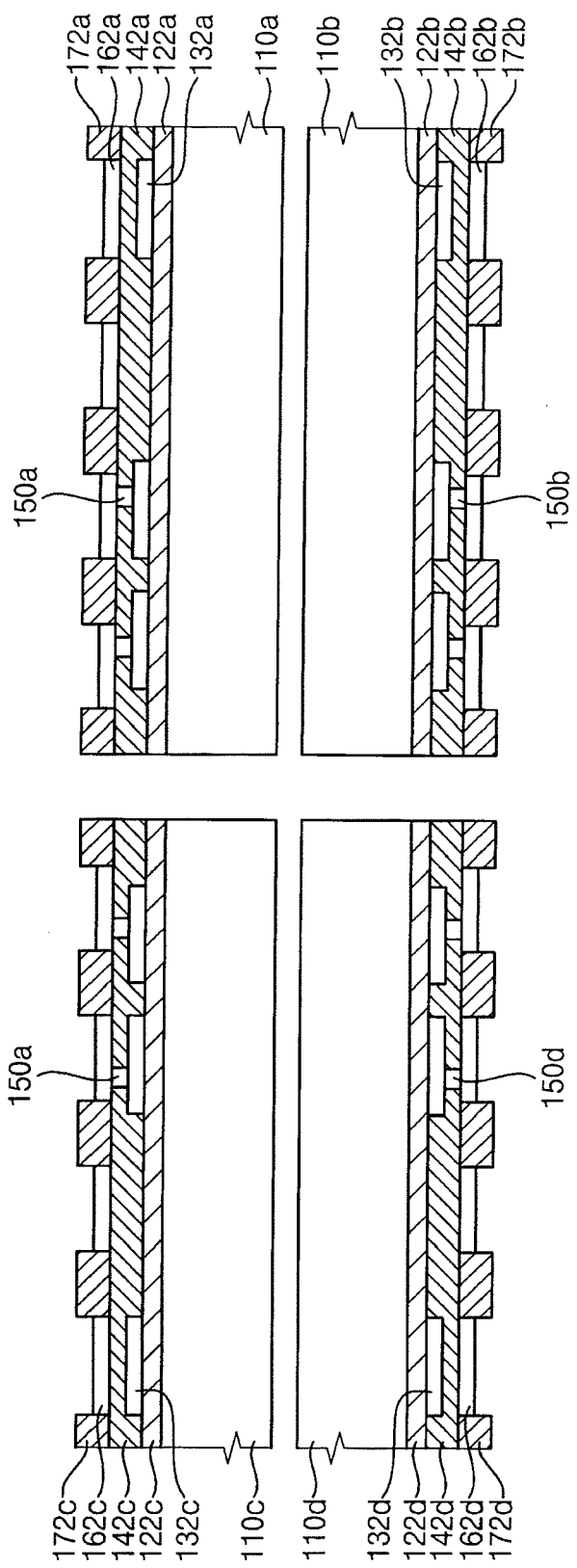

Referring to FIG. 12, after the adhesive layer is removed to separate the first and second preliminary substrate 10a and 10b, the first and second preliminary substrates are respectively divided to form a plurality of substrates 110a, 110b, 110c and 110d.

For example, the adhesive layer and cutting regions of the first and second preliminary substrate 10a and 10b may be removed by a sawing process to form the substrates 110a, 110b, 110c and 110d.

Referring to FIG. 13, a window 180 for wire bonding is formed in the substrate 110. For example, the substrate 110 may be partially removed using a router bit to form the window 180 in the middle region of the substrate 110.

In an exemplary embodiment, as illustrated in FIG. 1, the window 180 may be formed in the middle region of the substrate 110 such that the first and second bonding pads 166 and 168 alternate with each other along a side of the window 180.

Figure 14:
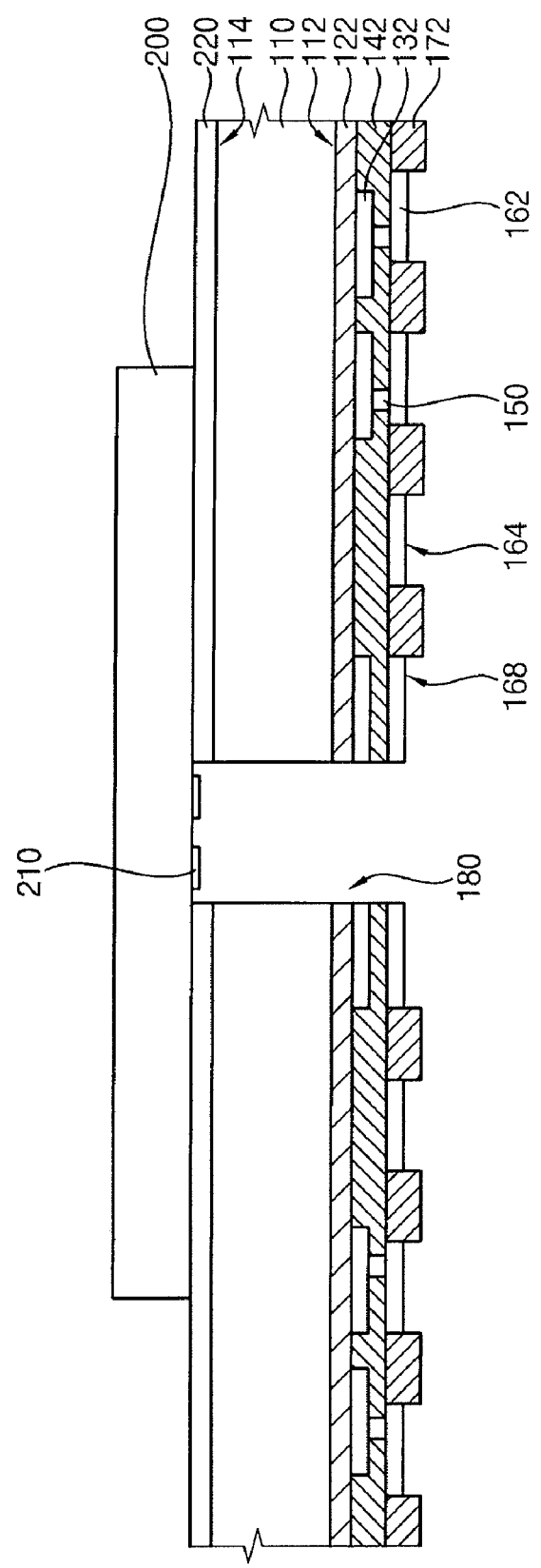

Referring to FIG. 14, a semiconductor chip 200 is disposed on the substrate 110. The semiconductor chip 200 may be adhered to the second surface 114 of the substrate 110 such that chip pads 210 of the semiconductor chip 200 are exposed through the window 180. For example, the semiconductor chip 200 may be adhered to the substrate 110 using an adhesive film 220.

Figure 15:
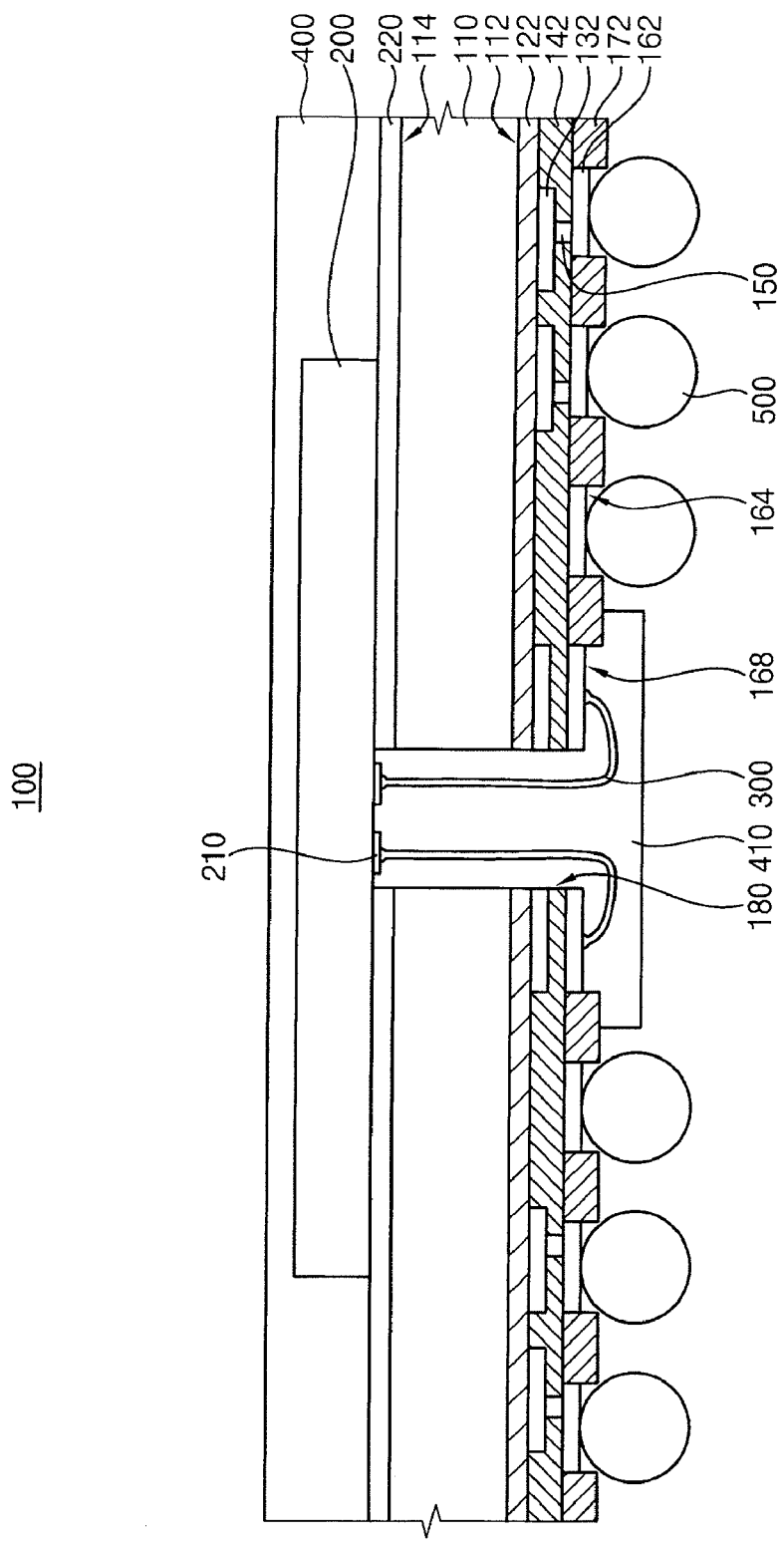

Referring to FIG. 15, the chip pads 210 of the semiconductor chip 200 are electrically connected to the first and second bonding pads 166 and 168 using a plurality of bonding wires 300.

Then, a first sealing member 400 is formed on the second surface 114 of the substrate 110 to cover the semiconductor chip 200, to protect the semiconductor chip 200 from the outside. A second sealing member 410 is formed on the first surface 112 of the substrate 110 to cover the bonding wires 300 and the window 130.

After solder balls 500 are disposed on the solder ball pads 164, the semiconductor package 100 is mounted on a module substrate (not illustrated) via the solder balls 500 to complete a memory module (not illustrated).

Figure 16:
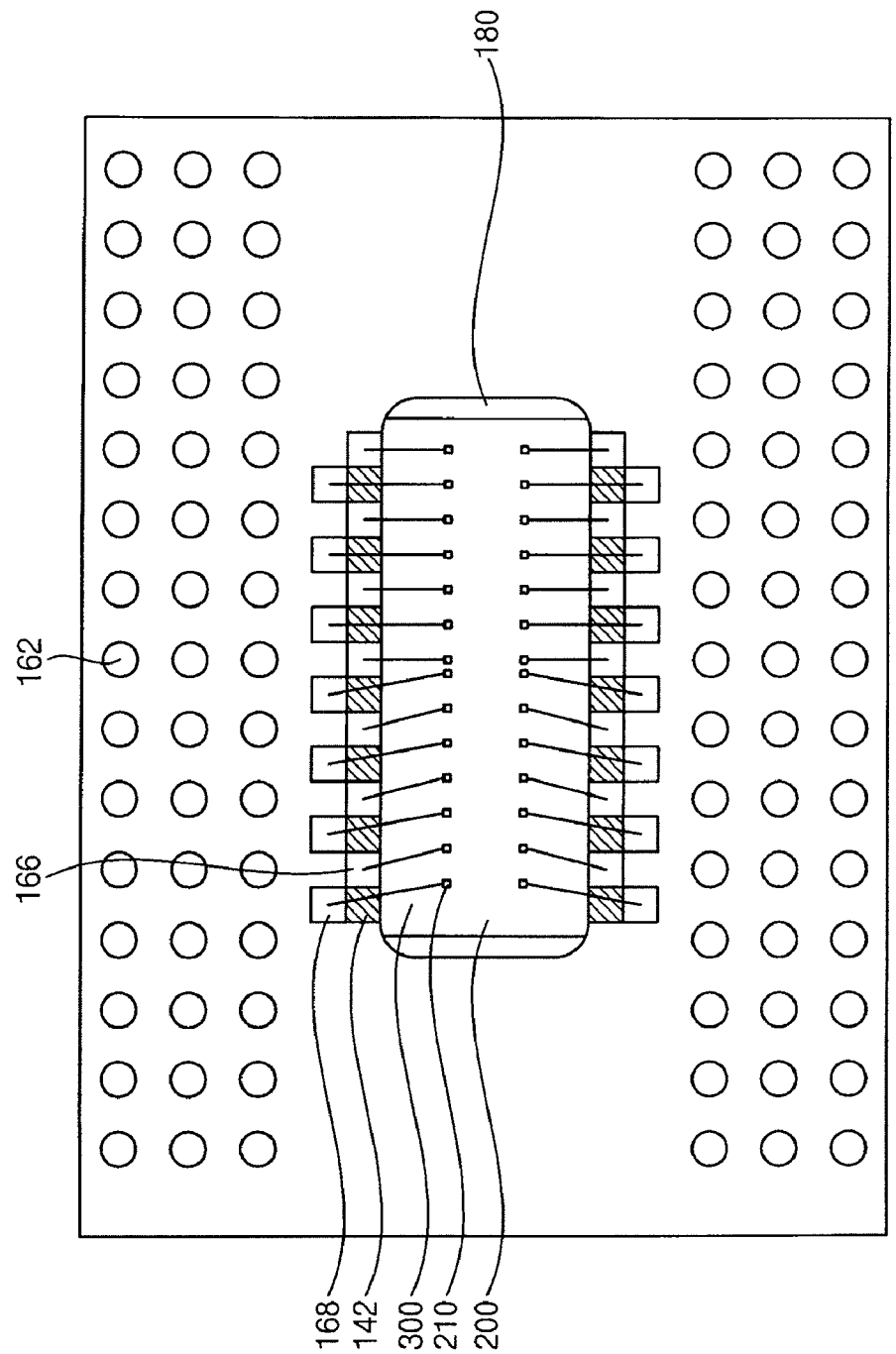
Figure 17:
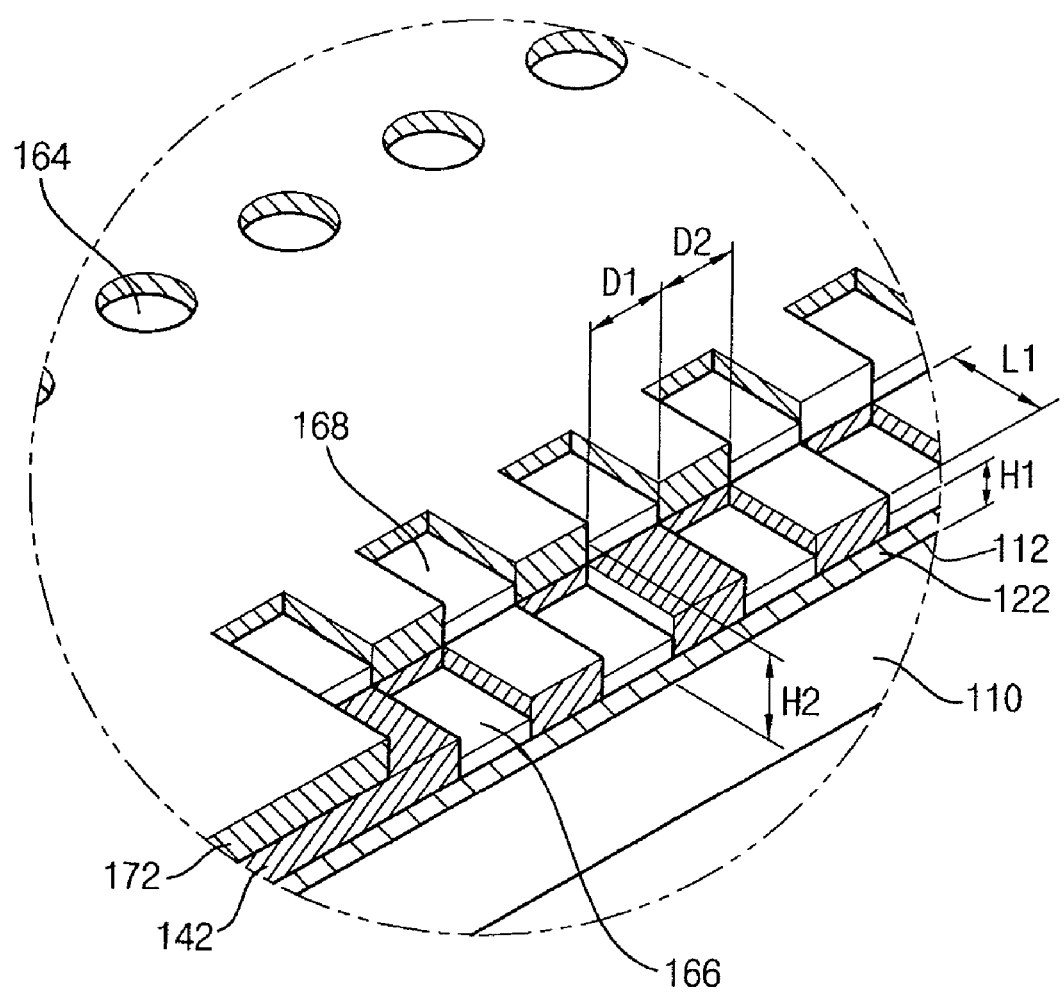

FIG. 16 is a plan view illustrating a semiconductor package in accordance with another exemplary embodiment of the inventive concept. FIG. 17 is a perspective view illustrating first and second bonding pads of the semiconductor package in FIG. 16. The semiconductor package of the present embodiment is substantially the same as in the embodiment of FIG. 1 except arrangements of first and second bonding pads. Thus, the same reference numerals will be used to refer to the same or like elements as those described in the embodiment of FIG. 1 and any further repetitive explanation concerning the above elements will be omitted.

Referring to FIGS. 16 and 17, first and second bonding pads 166 and 168 may be arranged along the side of a window 180 in a first surface 112 of a substrate 110. The first bonding pads 166 may be connected to a first wiring layer 132 and the second bonding pads 168 may be connected to a second wiring layer 162.

As illustrated in FIGS. 16 and 17, the first and second bonding pads 166 and 168 may alternate with each other along the side of the window 180. The first bonding pad 166 may have a first height H1 from the first surface 112 of the substrate 110 and the second bonding pad 168 may have a second height H2 greater than the first height H1 from the first surface 112 of the substrate 110.

The first bonding pads 166 may be spaced apart from each other by a first distance D1 and the second bonding pads 168 may be spaced apart from each other by a second distance D2. The first distance D1 may be substantially identical to the second distance D2.

The first distance D1 may be substantially identical to the second width of the second bonding pad 168. The second distance D2 may be substantially identical to the first width of the first bonding pad 166.

The first and second bonding pads 166 and 168 may have rectangular shapes. The first and second bonding pads 166 and 168 may extend substantially perpendicular to the extending direction of the window 180.

In another exemplary embodiment, the second bonding pads 168 may be farther away from the side of the window 180 than the first bonding pads 166. The second bonding pad 168 may be spaced back by a longitudinal length (L1) of the first bonding pad 166 from the side of the window 180.

According to another exemplary embodiment, a mounting substrate for a semiconductor chip may include a plurality of the first and second bonding pads 166 and 168 having a concavo-convex arrangement along the side of the window 180 in the surface of the substrate 110. The second bonding pads 168 may be spaced farther away from the side of the window 180 than the first bonding pads 166.

Accordingly, the bonding wires 300 may be connected respectively to the first and second boding pads 166 and 168 having different heights from the surface of the substrate and having different distances from the window 180. Thus, an electrical short or interference between adjacent bonding wires respectively connected to the adjacent first and second bonding pads 166 and 168 may be prevented.

Hereinafter, a method of manufacturing a semiconductor package in accordance with another exemplary embodiment will be explained.

First, the processes as illustrated in FIGS. 5 to 11 are performed to form the first and second wiring layers 32a, 32b, 62a, 62b having a multi-layered structure. The first and second wiring layers are sequentially formed on the first surfaces 12a and 12b of the first and second preliminary substrates 10a and 10b with at least one insulation layer interposed between the first and second wiring layers.

In another exemplary embodiment, first bonding pad portions of the first wiring layers 32a and 32b and second bonding pad portions of the second wiring layers 62a and 62b may be arranged to have a concavo-convex arrangement along a side of a window that is formed by a following process. The second bonding pad portions may be formed farther away from the side of the window than the first bonding pad portions.

The first bonding pad portions of the first wiring layers 32a and 32b may be exposed through the first and second insulation layer patterns 42a, 42b, 72a and 72b, respectively. The second bonding pad portions and the solder ball pad portions of the second wiring layers 62a and 62b may be exposed through the second insulation layer patterns 72a and 72b, respectively.

Then, a plating process is performed using a plating wiring (not illustrated) that is connected to the first and second wiring layers 32a, 32b, 62a and 62b to form plating layers on the first bonding pad portions, the second bonding pad portions and the solder ball pad portions exposed through the first and second insulation layer patterns 42a, 42b, 72a and 72b, respectively. The plating process may be an electroplating process.

The processes as illustrated in FIGS. 12 and 13 are performed to form respectively a separated substrate 110 having a window 180 formed therein.

In another exemplary embodiment, as illustrated in FIGS. 16 and 17, a plurality of the first and second bonding pads 166 and 168 may be arranged on the surface of the substrate 110 along the side of the window 180 having a concavo-convex arrangement. The second bonding pads 168 may be farther away from the side of the window 180 than the first bonding pads 166. The second bonding pad 168 may be spaced apart from the side of the window 180 by a longitudinal length (L1) of the first bonding pad 166.

Accordingly, the bonding wires 300 may be connected respectively to the first and second boding pads 166 and 168 having different heights from the surface of the substrate and having different distances from the window 180. Thus, an electrical short or interference between adjacent bonding wires respectively connected to the adjacent first and second bonding pads 166 and 168 may be prevented.

Then, after the processes as illustrated in FIGS. 14 and 15 are performed to form a semiconductor chip 200 on the substrate 110, solder balls 500 are disposed on the solder ball pads 164 and then the semiconductor package 100 is mounted on a module substrate (not illustrated) via the solder balls 500 to complete a memory module (not illustrated).

As mentioned above, a mounting substrate, for a semiconductor chip in accordance with exemplary embodiments of the inventive concept may include first and second wiring layers having a multi-layered structure. The first and second wiring layers are sequentially formed on a surface of a substrate with at least one insulation layer interposed between the first and second wiring layers. The mounting substrate may include a plurality of first and second bonding pads having a concavo-convex arrangement that are arranged along a side of a window 180 in the surface of the substrate. The first and second bonding pads may be connected to the first and second wiring layers, respectively.

Accordingly, signal paths between the first and second wiring layers may be shortened as compared to those between wiring layers that are respectively formed on opposite surfaces of the substrate, to thereby improve the high speed performance of a semiconductor package. Further, the first and second bonding pads are respectively arranged on the first and second wiring layers to have different heights from the surface of the substrate. Accordingly, the spacing distance between the first and second bonding pads may be minimized and a contact failure between adjacent bonding wires respectively connected to the adjacent first and second bonding pads may be prevented.

The foregoing is illustrative of exemplary embodiments and is not to be construed as limiting thereof. Although a few exemplary embodiments have been described, those skilled in the art will readily appreciate that many modifications are possible in other exemplary embodiments without materially departing from the novel teachings of the present inventive concept. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A wiring substrate for a semiconductor chip, comprising:
    a substrate having a first surface and a second surface opposite to the first surface, the substrate having a window from the first surface to the second surface;
    first and second wiring layers having a multi-layered structure and sequentially formed on the second surface of the substrate with at least one insulation layer interposed between the first and second wiring layers; and
    a plurality of first and second bonding pads respectively connected to the first and second wiring layers, the first and second bonding pads having a concavo-convex arrangement on the second surface of the substrate along a side of the window, wherein the plurality of the first and second bonding pads alternate with each other.

2. The wiring substrate of claim 1, wherein the first bonding pad has a first height from the second surface of the substrate and the second bonding pad has a second height greater than the first height from the second surface of the substrate.

3. The wiring substrate of claim 1, wherein the first bonding pads are spaced apart from each other by a first distance and the second bonding pads are spaced apart from each other by a second distance substantially identical to the first distance.

4. The wiring substrate of claim 1, wherein the first bonding pads are spaced apart from each other by a first distance and the width of the second bonding pad is substantially identical to the first distance.

5. The wiring substrate of claim 1, wherein the second bonding pads are farther away from the side of the window than the first bonding pads.

6. The wiring substrate of claim 1, wherein the first and second bonding pads extend substantially perpendicular to the side of the window.

7. A semiconductor package, comprising:
    a substrate having a first surface and a second surface opposite to the first surface, the substrate having a window;
    a semiconductor chip adhered to the first surface of the substrate, said semiconductor chip having chip pads exposed through the window;
    first and second wiring layers having a multi-layered structure and sequentially formed on the second surface of the substrate with at least one insulation layer interposed between the first and second wiring layers;
a plurality of first and second bonding pads respectively connected to the first and second wiring layers, the first and second bonding pads having a concavo-convex arrangement on the second surface of the substrate along a side of the window, wherein the first bonding pads are spaced apart from each other by a first distance and the width of the second bonding pad is substantially identical to the first distance; and
a plurality of bonding wires extending from the chip pads through the window to connect to the first and second bonding pads.

8. The semiconductor package of claim 7, wherein a plurality of the first and second bonding pads alternate with each another.

9. The semiconductor package of claim 7, wherein the first bonding pad has a first height from the second surface of the substrate and the second bonding pad has a second height greater than the first height from the second surface of the substrate.

10. The semiconductor package of claim 7, wherein the first bonding pads are spaced apart from each other by a first distance and the second bonding pads are spaced apart from each other by a second distance substantially identical to the first distance.

11. The semiconductor package of claim 7, wherein the second bonding pads are farther away from the side of the window than the first bonding pads.

* * * * *